United States Patent
Hong et al.

(10) Patent No.: US 7,649,672 B2
(45) Date of Patent: Jan. 19, 2010

(54) MEMS STRUCTURE AND METHOD OF FABRICATING THE SAME

(75) Inventors: Young-tack Hong, Suwon-si (KR); Jong-seok Kim, Hwaseong-si (KR); In-sang Song, Seoul (KR); Sang-wook Kwon, Seongnam-si (KR); Seung-jin Oh, Daejeon (KR); Eun-sung Lee, Daejeon (KR); Seung-tae Choi, Daejeon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 190 days.

(21) Appl. No.: 11/582,964

(22) Filed: Oct. 19, 2006

(65) Prior Publication Data

US 2008/0007814 A1    Jan. 10, 2008

(30) Foreign Application Priority Data

Jul. 10, 2006   (KR)   .......................... 10-2006-64527

(51) Int. Cl.
    *G02B 26/00*   (2006.01)

(52) U.S. Cl. .................................................. 359/291
(58) Field of Classification Search .......... 359/290–296
    See application file for complete search history.

(56) References Cited

U.S. PATENT DOCUMENTS

| | | | | |
|---|---|---|---|---|
| 6,331,257 | B1 * | 12/2001 | Loo et al. ..................... | 216/13 |
| 6,384,353 | B1 * | 5/2002 | Huang et al. ................ | 200/181 |
| 2004/0061543 | A1 * | 4/2004 | Nam et al. .................. | 327/342 |

FOREIGN PATENT DOCUMENTS

KR   10-2006-0011255 A   2/2006

* cited by examiner

*Primary Examiner*—Ricky L. Mack
*Assistant Examiner*—Vipin M Patel
(74) *Attorney, Agent, or Firm*—Sughrue Mion, PLLC

(57) ABSTRACT

A MEMS structure includes an element substrate, an electrode pad formed on the element substrate, a MEMS activated element formed on the element substrate, and having an electrode-connecting layer, and a connecting line to electrically connect the electrode pad and the electrode-connecting layer.

12 Claims, 4 Drawing Sheets

MEMS STRUCTURE AND METHOD OF FABRICATING THE SAME

This application claims priority under 35 U.S.C. § 119(a) from Korean Patent Application No. 10-2006-64527 filed on Jul. 10, 2006 in the Korean Intellectual Property Office, the entire disclosure of which is incorporated herein by reference.

BACKGROUND OF THE INVENTION

1. Field of the Invention

Apparatuses and methods consistent with the present invention relate to a Micro Electro Mechanical System (MEMS) structure, and in particular to a method of fabricating the MEMS structure.

2. Description of the Related Art

What is called a MEMS technique is a technique of fabricating MEMS structures, such as a micro switch, a mirror, a sensor, precision instrument parts, etc., using a semiconductor processing technique. The MEMS technique is acknowledged as a technique of increasing performance and reducing fabrication costs owing to the use of the semiconductor processing technique, which provides high precision in working, high uniformity of manufactures, superior productivity, etc.

FIG. 1 is a schematic structure view exemplifying a general MEMS structure. As illustrated in the drawing, on an element substrate 10 are formed an electrode pad 20, a MEMS activated element 30, and a connecting line 40 to electrically connect the electrode pad 20 and the MEMS activated element 30. To form a MEMS structure, such as a micro switch, a sensor, etc., a region of the MEMS activated element 30, which is formed of a general material of silicon derivative, is etched by a dry etching method. Above the MEMS activated element 30 is combined with the element substrate 10 a packaging substrate 50 to protect the MEMS activated element 30.

However, according to the general MEMS structure constructed as described above, a notch 30a (see FIG. 2) may be formed in a lower part of a side of the MEMS activated element 30 adjacent to exposed surface of the element substrate 10 during the etching process of the MEMS activated element 30. In this case, a problem occurs, in that an electrical disconnection portion 40a is formed in the connecting line 40 due to the notch 30a, thereby resulting in an electric defect. Particularly, as the MEMS activated element 30 is etched until the region, is completely removed thus to expose a surface of the element substrate 10, a problem occurs, in that an area, which generates the notch 30a, is much enlarged since a thickness of the side of the MEMS activated element 30 is very thick.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

An aspect of the present invention addresses at least the above problems and/or disadvantages and provides at least the advantages described below. Accordingly, an aspect of the present invention is to provide a MEMS structure having an improved structure that can prevent an electrical defect irrespective of notch generation.

Additional aspects and advantages of the invention will be set forth in part in the description which follows and, in part, will be obvious from the description, or may be learned by practice of the invention.

According to one aspect of an exemplary embodiment of the present invention, a MEMS structure includes an element substrate, an electrode pad formed on the element substrate, a MEMS activated element formed on the element substrate, and having an electrode-connecting layer with a specified thickness, and a connecting line to electrically connect the electrode pad and the electrode-connecting layer.

The electrode-connecting layer may be integrally formed with a lower part of a side of the MEMS activated element.

The electrode-connecting layer may be formed of a lower portion with a specified thickness remaining in a region of the MEMS activated element after an upper portion in the region of the MEMS activated element is etched and removed.

The specified thickness of the electrode-connecting layer may be in the range of less than 5 μm.

The connecting line may have one side connected to the electrode pad, and the other side connected with the electrode-connecting layer to surround the electrode-connecting layer.

The connecting line may be formed by depositing a metal in a specified thickness.

The MEMS structure may further include a packaging substrate combined with the element substrate above the MEMS activated element.

According to another aspect of an exemplary embodiment of the present invention, a method of fabricating a MEMS structure includes forming a MEMS activated element on an element substrate on which an electrode pad is formed, forming an electrode-connecting layer with a specified thickness in the MEMS activated element, forming a connecting line to connect the electrode pad and the electrode-connecting layer, and etching the MEMS activated element in a pattern to form a desired structure.

At the forming the electrode-connecting layer, the electrode-connecting layer may be formed of a lower portion with a specified thickness remaining in a region of the MEMS activated element after an upper portion in the region of the MEMS activated element is etched and removed.

At the forming the electrode-connecting layer, the specified thickness of the electrode-connecting layer may be in the range of less than 5 μm.

At the forming the connecting line, the connecting line may be formed by depositing a metal in a specified thickness.

The method may further include packaging an upper part of the MEMS activated element.

BRIEF DESCRIPTION OF THE DRAWINGS

The above and other aspects of the present invention will be more apparent from the description for an exemplary embodiment of the present invention taken with reference to the accompanying drawings, in which.

Throughout the drawings, the same drawing reference numerals will be understood to refer to the same elements, features, and structures.

DETAILED DESCRIPTION OF THE EXEMPLARY, NON-LIMITING EMBODIMENTS OF THE INVENTION

Hereinafter, a MEMS structure and a method of fabricating the same according to an exemplary embodiment of the present invention will now be described in greater detail with reference to the accompanying drawings.

Figure 1:
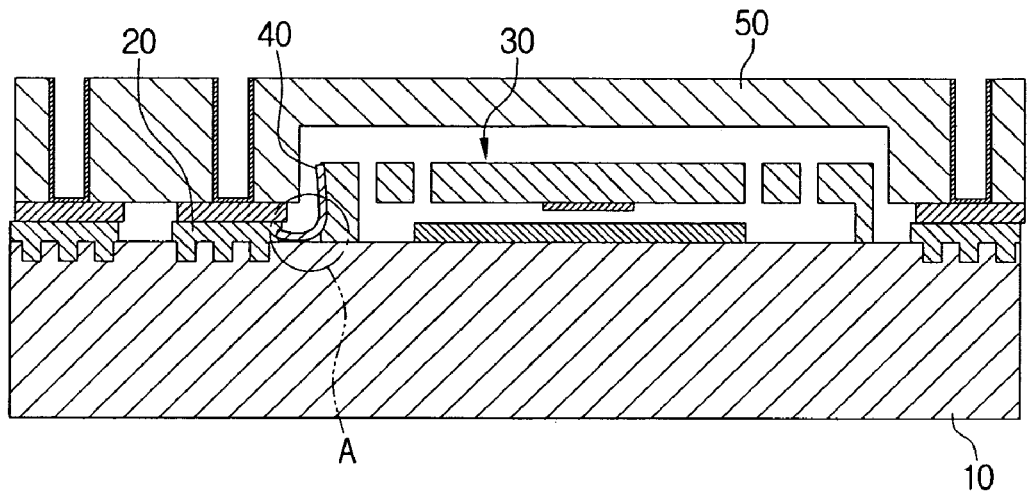
FIG. 1 is a schematic structure view exemplifying a general MEMS structure.
Figure 2:
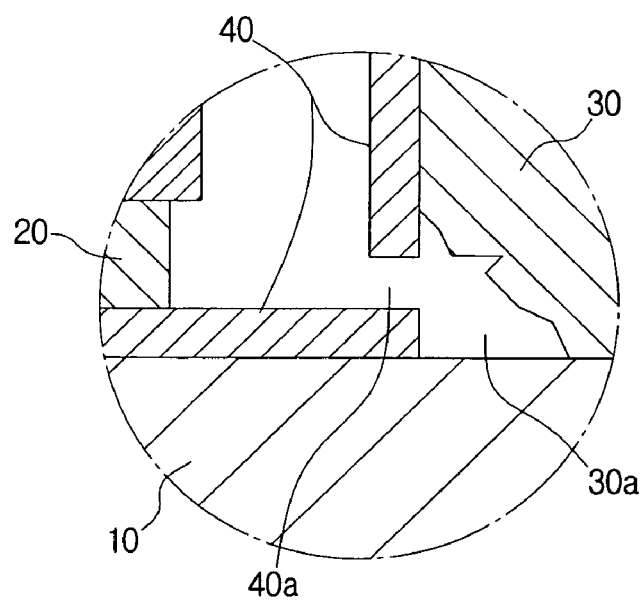
FIG. 2 is an enlarged view of a portion A of FIG. 1.
Figure 3:
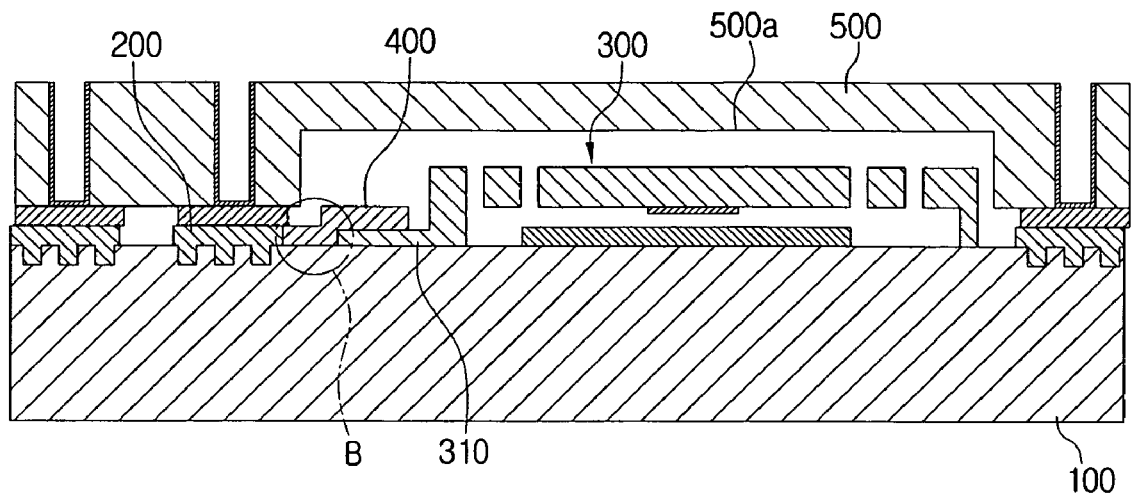
FIG. 3 is a schematic structure view exemplifying a MEMS structure according to an exemplary embodiment of the present invention.
Figure 4:
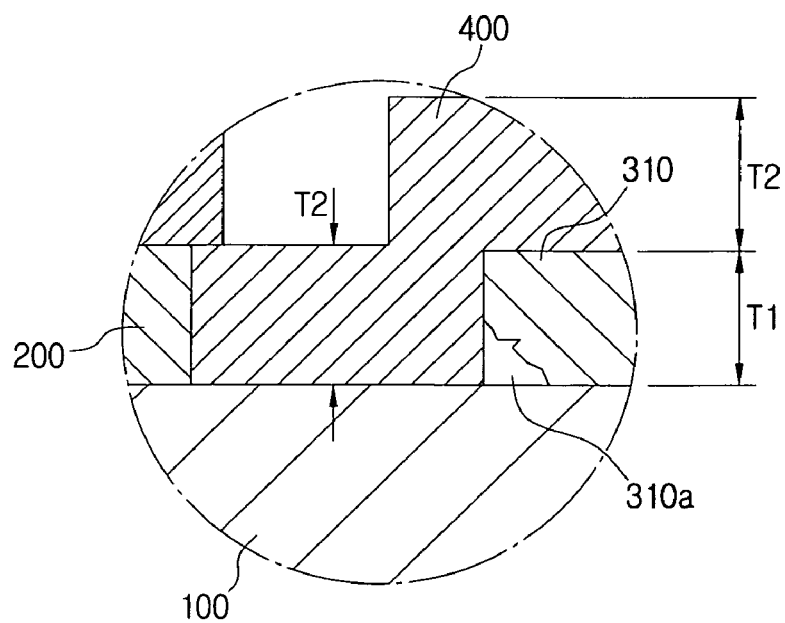
FIG. 4 is an enlarged view of a portion B of FIG. 3.

FIG. 3 is a schematic structure view exemplifying a MEMS structure according to an exemplary embodiment of the present invention, and FIG. 4 is an enlarged view of a portion B of FIG. 3.

As illustrated in FIGS. 3 and 4, the MEMS switch according to the exemplary embodiment of the present invention includes a substrate 100, an electrode pad 200, a MEMS activated element 300, a connecting line 400, and a packaging substrate 500.

On the element substrate 100 are formed the electrode pad 200 and the MEMS activated element 300.

The electrode pad 200 is one of a driving electrode to apply a voltage to the MEMS activated element 300, and a ground electrode to ground the MEMS activated element 300. The electrode pad 200 is usually formed of Au.

The MEMS activated element 300 is bonded on the element substrate 100. The MEMS activated element 300 is formed of a general material of silicon derivative. An electrode-connecting layer 310 is integrally formed with a lower part of a side of the MEMS activated element 300. The electrode-connecting layer 310 is formed, such that a thickness T1 thereof is in the range of less than 5 μm, preferably a range that approximately corresponds to a thickness T2 of the connecting line 400.

The connecting line 400 electrically connects the electrode pad 200 and the electrode-connecting layer 310. The connecting line 400 at one side thereof is connected to the electrode pad 200, and at the other side thereof is connected with the electrode-connecting layer 310 surrounding the MEMS activated element. Preferably, the connecting line 400 is formed in the thickness T2 of less than 5 μm by depositing a metal material, e.g., Au, which is equal to the electrode pad 200.

The packaging substrate 500 is bonded with the element substrate 100 above the MEMS activated element 300 to protect the MEMS activated element 300. The packaging substrate 500 is formed of a glass material, and has a space 500a formed in an undersurface thereof to receive the MEMS activated element 300.

Hereinafter, a method of fabricating the MEMS structure according to the exemplary embodiment of the present invention constructed as described above will now be described in details with reference to FIGS. 5A through 5E.

Figure 5A:
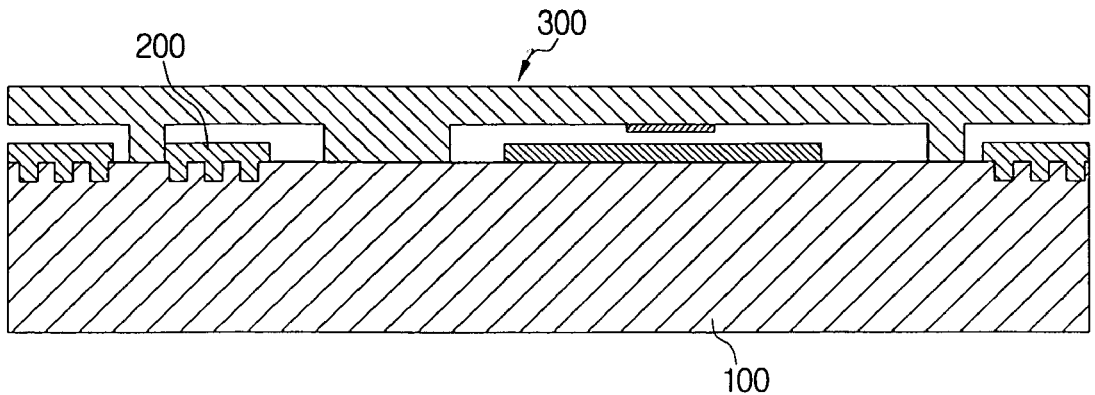
FIGS. 5A through 5E are process views exemplifying a method of fabricating the MEMS structure according to the exemplary embodiment of the present invention.

First, as illustrated in FIG. 5A, a MEMS activated element 300 is formed on an element substrate 100 on which an electrode pad 200 is formed.

Figure 5B:
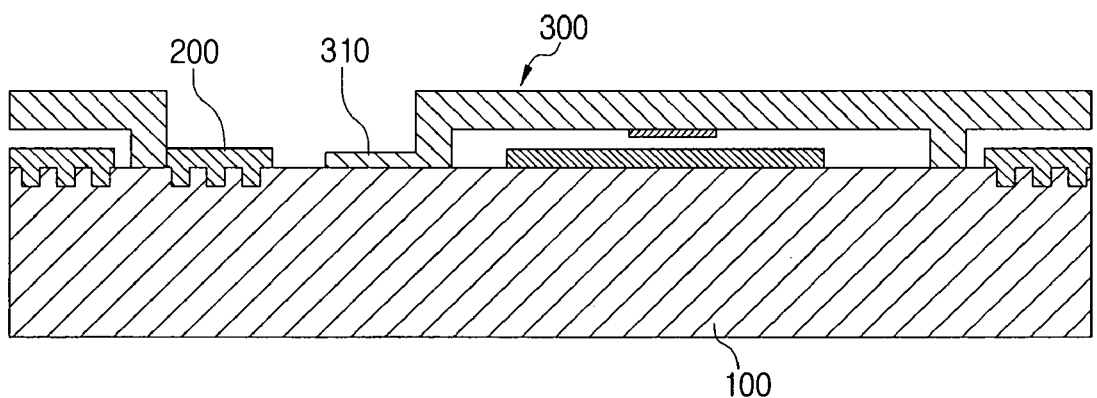

Next, as illustrated in FIG. 5B, an electrode-connecting layer 310 is integrally formed with a lower part of a side of the MEMS activated elements 300. The electrode-connecting layer 310 is formed of a lower portion remaining by a thickness T1 (see FIG. 4) of less than 5 μm in a region of the MEMS activated element 300 after an upper portion of the region of the MEMS activated element 300 is etched and removed. That is, the MEMS activated element 300 is etched in a pattern until the region, which is etched, is not completely removed to expose a surface of the element substrate 100, but remained by the thickness of less than 5 μm, so that the electrode-connecting layer 310 is formed. The etching process of the MEMS activated element 300 is carried out by a dry etching method of using gas, plasma, ion beam, etc. During the etching process of the MEMS activated element 300, a notch 310a (see FIG. 4) can be formed in a side surface of the electrode-connecting layer 310 adjacent to exposed surface of the element substrate 100. However, as the thickness T1 of the electrode-connecting layer 310 is very thin by less than 5 μm, an area of the notch 310a is very small even though the notch 310a is formed during the etching process of the MEMS activated element 300.

Figure 5C:
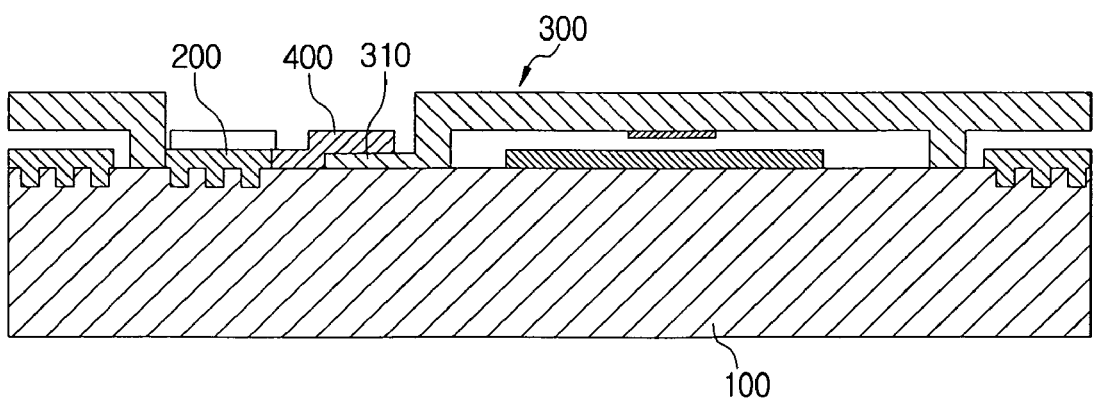

Thereafter, as illustrated in FIG. 5C, a connecting line 400 is formed to electrically connect the electrode pad 200 and the electrode-connecting layer 310. The connecting line 400 is formed by depositing a metal in a thickness T2 (see FIG. 4) of less than 5 μm. Since the area of the notch 310a is very small even though the notch 310a is formed during the etching process of the MEMS activated element 300, an electrical disconnection portion is not formed in the connecting line 400 due to the notch 310a. Accordingly, an electrical defect is not generated irrespective of the notch generation, so that the electrode pad 200 can be stably connected to the MEMS activated element 300.

Figure 5D:
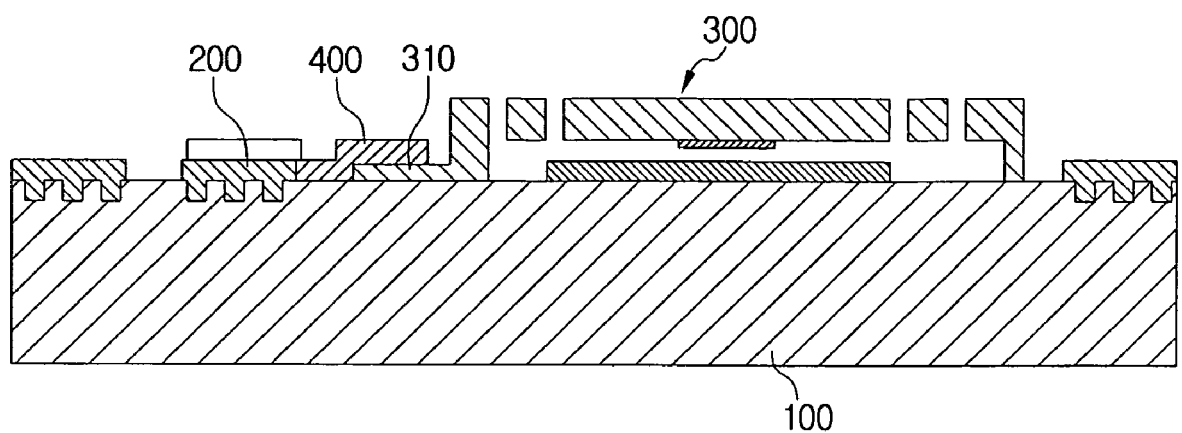

Next, as illustrated in FIG. 5D, the MEMS activated element 300 is etched in a pattern to form a desired structure, e.g., a micro switch, a sensor, etc.

Figure 5E:
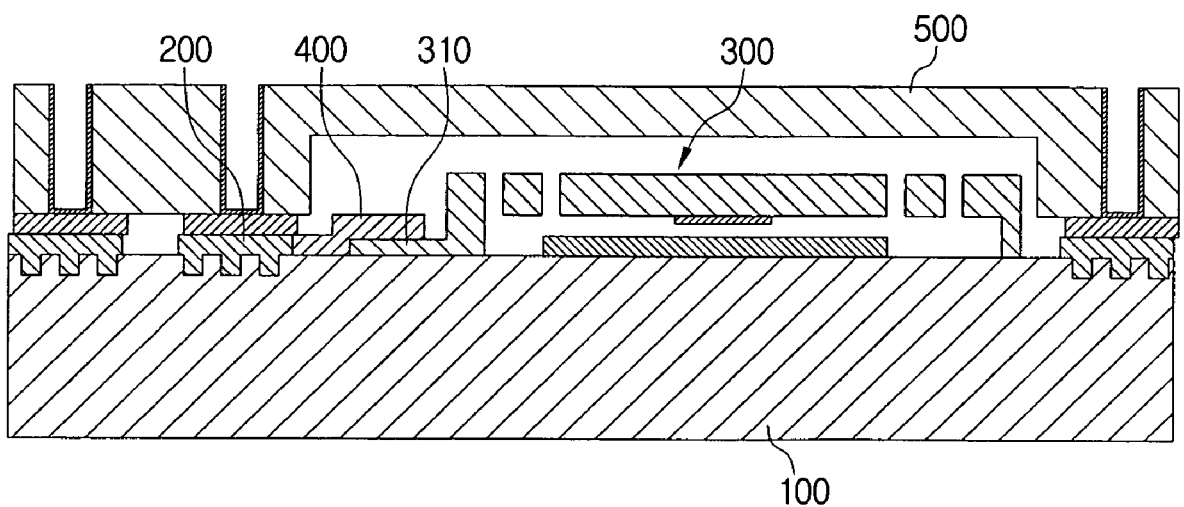

Thereafter, as illustrated in FIG. 5E, the element substrate 100 is packaged to protect the MEMS activated element 300. That is, a packaging substrate 500 of glass material is bonded with the element substrate 100 above the MEMS activated element 300.

As apparent from the foregoing description, according to the exemplary embodiment of the present invention, the MEMS structure is configured, so that the portion, i.e., the electrode-connecting layer in which the notch is generated, has the thin thickness. Accordingly, the MEMS structure according to the exemplary embodiment of the present invention can prevent the electrical defect irrespective of the notch generation.

Although representative embodiment embodiments of the present invention has been shown and described in order to exemplify the principle of the present invention, the present invention is not limited to the specific exemplary embodiment. It will be understood that various modifications and changes can be made by one skilled in the art without departing from the spirit and scope of the invention as defined by the appended claims. Therefore, it shall be considered that such modifications, changes and equivalents thereof are all included within the scope of the present invention.

What is claimed is:

1. A MEMS structure comprising:
   an element substrate;
   an electrode pad formed on the element substrate;
   a MEMS activated element formed on the element substrate and having an electrode-connecting layer; and
   a connecting line formed on the element substrate and the electrode-connecting layer between the electrode pad and the electrode-connecting layer, the connecting line providing an electrical connection between the electrode pad and the electrode-connecting layer.

2. The MEMS structure as claimed in claim 1, wherein the electrode-connecting layer is integrally formed with a lower part of a side of the MEMS activated element.

3. The MEMS structure as claimed in claim 1, wherein the electrode-connecting layer comprises a lower portion remaining in a region of the MEMS activated element after an upper portion in the region of the MEMS activated element is etched and removed.

4. The MEMS structure as claimed in claim 1, wherein the electrode-connecting layer has a thickness in the range of less than 5 μm.

5. The MEMS structure as claimed in claim 1, wherein the connecting line has one side connected to the electrode pad, and the other side connected with the electrode-connecting layer.

6. The MEMS structure as claimed in claim 1, wherein the connecting line comprises a metal.

7. The MEMS structure as claimed in claim 1, further comprising a packaging substrate combined with the element substrate above the MEMS activated element.

8. A method of fabricating a MEMS structure comprising:
   forming a MEMS activated element on an element substrate on which an electrode pad is formed;
   forming an electrode-connecting layer in the MEMS activated element;
   forming a connecting line on the element substrate and the electrode-connecting layer between the electrode pad and the electrode-connecting layer, the connecting line providing an electrical connection between the electrode pad and the electrode-connecting layer; and
   etching the MEMS activated element in a pattern.

9. The method as claimed in claim 8, wherein at the forming the electrode-connecting layer, the electrode-connecting layer is formed of a lower portion remaining in a region of the MEMS activated element after an upper portion in the region of the MEMS activated element is etched and removed.

10. The method as claimed in claim 8, wherein at the forming the electrode-connecting layer, a thickness of the electrode-connecting layer is in the range of less than 5 μm.

11. The method as claimed in claim 8, wherein at the forming the connecting line, the connecting line is formed by depositing a metal.

12. The method as claimed in claim 8, further comprising packaging an upper part of the MEMS activated element in combination with the element substrate above the MEMS activated element.

* * * * *